United States Patent
Shvartser

(10) Patent No.: US 8,102,374 B2
(45) Date of Patent: Jan. 24, 2012

(54) METHOD AND DEVICE FOR INPUT OF SYMBOL AND KEY-FUNCTION INFORMATION INTO A DIGITAL DATA PROCESSOR

(76) Inventor: Konstantin Efimovich Shvartser, Pompano Beach, FL (US)

( * ) Notice: Subject to any disclaimer, the term of this patent is extended or adjusted under 35 U.S.C. 154(b) by 371 days.

(21) Appl. No.: 12/386,599

(22) Filed: Apr. 21, 2009

(65) Prior Publication Data
US 2009/0324316 A1    Dec. 31, 2009

(30) Foreign Application Priority Data
Jun. 26, 2008    (RU) ................................. 2008125657

(51) Int. Cl.
*G09G 5/00*    (2006.01)
(52) U.S. Cl. ........................................................ 345/169
(58) Field of Classification Search .................. None
See application file for complete search history.

(56) References Cited

U.S. PATENT DOCUMENTS 5,087,910 A * 2/1992 Guyot-Sionnest ............ 345/169
2002/0163504 A1 * 11/2002 Pallakoff ........................ 345/169
2003/0122784 A1 * 7/2003 Shkolnikov .................... 345/169
2007/0198954 A1 * 8/2007 Dinn .............................. 715/864

* cited by examiner

Primary Examiner — Joseph Haley
(74) Attorney, Agent, or Firm — Aleksandr Smushkovich

(57) ABSTRACT

A method for hand inputting symbol and key-function information into a digital data processor comprises: providing a device including three keys for the left hand's middle, ring, and pinky fingers, three keys for the right hand's middle, ring, and pinky fingers, first and second joysticks including 'enter', 'left', 'right', 'up', and 'down' positions, operable in a main mode pressed by the thumb of one hand, and in a supplemental mode switched by the point finger of the other hand, assigning unique combinations of the keys and joysticks positions to fingers of each hand, thereby producing left-hand and right-hand tables, and converting the combinations of the tables into predetermined electrical signals, inputted into the data processor. In embodiments, the left-hand and right-hand tables are identical, can be preset by the user and/or by the manufacturer. The preferable time for pressing the joysticks in the supplemental mode is also provided.

4 Claims, 4 Drawing Sheets

Table 1
Commands entered with simultaneous pressing by fingers and by the thumb of a hand Pressing Main Joystick - the Enter Command

| Position of Main Joystick | Symbol Entered | | | | | | | | | | | |
|---|---|---|---|---|---|---|---|---|---|---|---|---|
| | ! | @ | # | $ | % | ^ | & | * | ( | ) | _ | + | ~ | Delete |
| Left | 1 | 2 | 3 | 4 | 5 | 6 | 7 | 8 | 9 | 0 | - | = | ` | Tab |
| Right | Q | W | E | R | T | Y | U | I | O | P | [ | ] | \ | CapsLock |
| Up | A | S | D | F | G | H | J | K | L | ; | ' | | " | { |
| Center | Z | X | C | V | B | N | M | , | . | / | < | > | ? | } |
| Down | | | | | | | | | | | | | | |

Simultaneously pressing fingers of a hand (x- pressed) according to the above symbols

| | | | | | | | | | | | | | | |
|---|---|---|---|---|---|---|---|---|---|---|---|---|---|---|
| Point Finger | X | | X | X | | | | X | | | X | X | | X |
| Middle Finger | X | X | X | | X | | | X | X | | | | X | X |
| Ring Finger | X | X | | | | X | | | | X | X | | | X |
| Pinky Finger | X | X | | | | | X | | | X | | X | X | X |

FIG. 3

Table 2
Commands entered with the supplemental joystick (by the point finger)

| Movement of Joystick | | Command |
|---|---|---|
| Left | | Backspace |
| Right | | Blank |
| Down | | Shift |
| Up | | Esc |
| Left | retaining ~ 0.6 seconds | Change of Language of Entry |
| Right | retaining ~ 0.6 seconds | Keypad Combination: Shift + Next Entered Symbol |
| Down | retaining ~ 0.6 seconds | Keypad Combination: Alt + Next Entered Symbol |
| Up | retaining ~ 0.6 seconds | Keypad Combination: Ctrl + Next Entered Symbol |

FIG. 4

METHOD AND DEVICE FOR INPUT OF SYMBOL AND KEY-FUNCTION INFORMATION INTO A DIGITAL DATA PROCESSOR

CROSS-REFERENCE TO RELATED APPLICATION

This U.S. patent application claims priority under 35 U.S.C. 119 (a) through (d) of Russian Federation patent applications RU2008125657 filed on 26 Jun. 2008 hereby entirely incorporated by reference.

FIELD OF THE INVENTION

The invention relates to the field of information input devices, particularly to input of symbols and key-functions from keypads into various apparatuses employing digital data processors.

BACKGROUND OF THE INVENTION

Generally, the existing keyboard or keypad equipment for data input should have a sufficiently large size to provide for typing without seeing the keyboard or keypad (herein called a 'blind' typing method). This however contradicts to the requirement of having a possible small size for such keyboard or keypad to provide portability of the equipment.

There is known a device for hand entry of discreet information into a computer, described in Inventor's Certificate of USSR No. 1760575, which is considered a closest related art document. A shortcoming of such device is that the maximum number of commands of a five-position joystick, which can be inputted with one movement (impression) of the operator, is ten (five directions of movement plus separation in time). Hence, for input of one symbol (number, letter, or a special character), one should accomplish up to 10-12 movements of the joystick.

In portable data input systems of computers, PDAs, smartphones, etc., it would be desirable to provide data input by the 'blind' method, while accomplishing the input with one hand.

BRIEF DESCRIPTION OF THE INVENTION

The present invention is dedicated to solving the aforementioned problem by providing input of symbols or key-functions (such as 'Shift', 'Ctrl', etc.) with one hand, by pressing one key, or simultaneously pressing two or three keys by the middle, ring, and pinky fingers, and by pressing a supplemental joystick by the point finger of the hand, and pressing a main joystick by the thumb of the hand.

The invention can find useful applications in military devices, where an operator, using such devices, has to control several controlling means simultaneously (e.g. targeting a device, etc.). This is also important to handicapped persons capable of operation with one hand only, or to blind people. It could be useful for a driver, who might need, for example, typing an SMS message not looking at the input keys.

BRIEF DESCRIPTION OF DRAWINGS

FIG. 3 is a first table, showing symbols and corresponding fingers positions, according to the preferred embodiment of the invention shown on FIG. 1.

FIG. 4 is a second table, showing key-functions and corresponding positions of the point finger, according to the preferred embodiment of the invention shown on FIG. 1.

DETAIL DESCRIPTION OF A PREFERRED EMBODIMENT OF THE INVENTION

Figure 1:
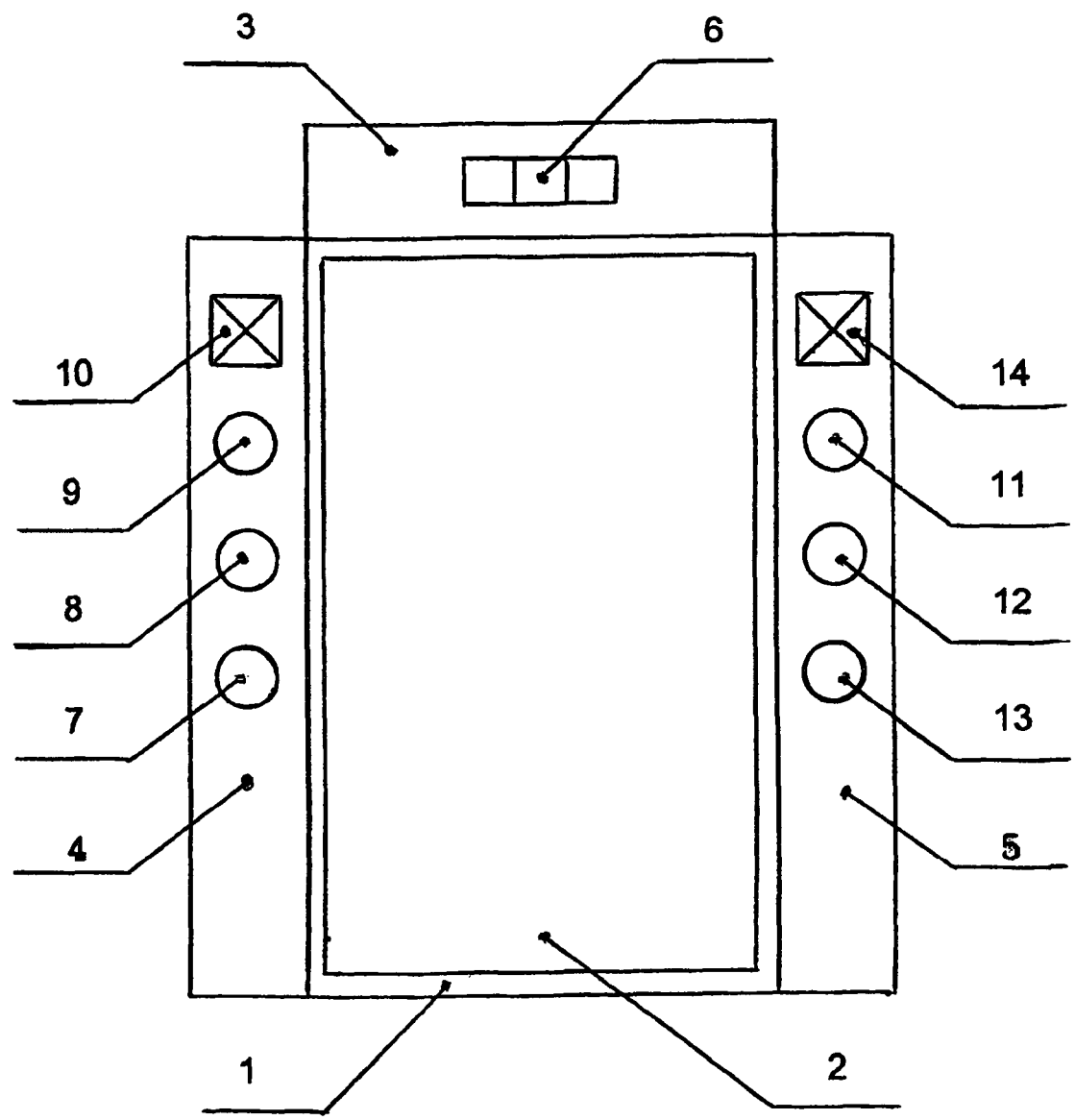
FIG. 1 shows a schematic view of a device for implementation of the aforesaid principles according to a preferred embodiment of the invention.
Figure 2:
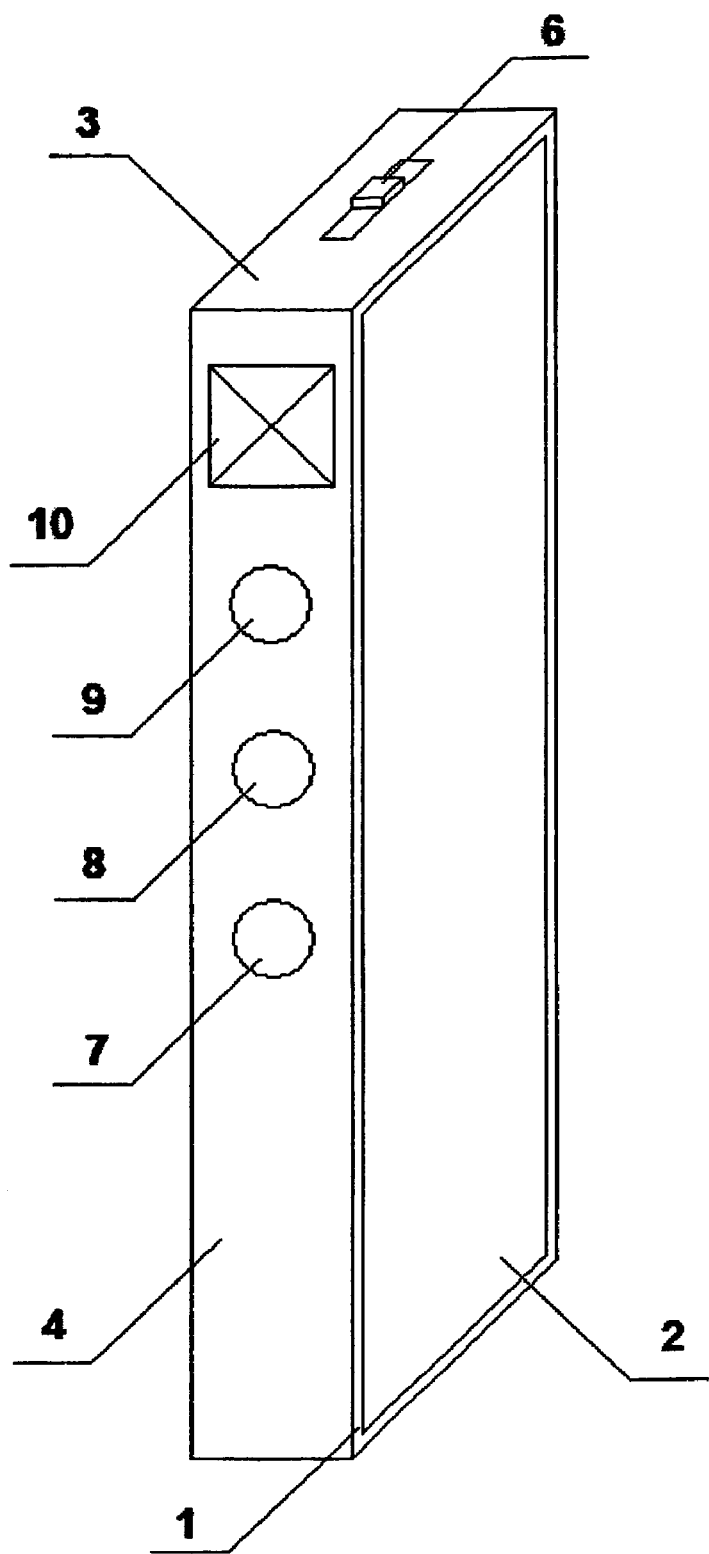
FIG. 2 shows an isometric view of the device according to the preferred embodiment of the invention shown on FIG. 1.

While the invention may be susceptible to embodiment in different forms, there are shown in the drawing, and will be described in detail herein, specific embodiments of the present invention, with the understanding that the present disclosure is to be considered an exemplification of the principles of the invention, and is not intended to limit the invention to that as illustrated and described herein.

Preferred Embodiment of Inventive Device

Reference numerals are designated to the following elements of a preferred embodiment of the inventive device, shown on FIG. 1, for hand inputting data into a digital data processor of a computer, a PDA, or another apparatus employing such processor:

1—a casing, shaped as a rectangular parallelepiped; 2—a display unit, disposed on the frontal side of the device; 3—an upper side of the device; 4—a left side of the device; 5—a right side of the device with control means; 6—a three-position switch of the following fixed positions: 'left hand', 'blocking the data entry', and 'right hand'; 7, 8, 9—keys to be pressed by the pinky finger, ring finger, or the middle finger of the right hand respectively; 10—a supplemental 5-position joystick to be pressed by the point finger of the right hand, or a main 5-position joystick to be pressed by the thumb of the left hand; 11, 12, 13,—keys to be pressed by the middle finger, ring finger, and pinky finger of the left hand respectively; 14—a supplemental 5-position joystick to be pressed by the point finger of the left hand, or a main 5-position joystick to be pressed by the thumb of the right hand. The circuitry of the switches and keys (not shown) are arranged inside the casing 1.

In the sample preferred embodiment shown on FIG. 1, the three-position switch 6 is mounted on the upper side 3. The keys 7, 8, and 9 (with fixed positions of the pinky finger, ring finger, and middle finger of the right hand respectively) are mounted on the left side 4. The keys 7, 8, and 9 are activated for the right hand operation, by the switch 6 set in the 'right hand' position. Where the operator can input data only by the left hand, the switch 6 is set into the 'left hand' position, and deactivates the keys 7, 8, and 9.

The joystick 10 is disposed above the key 9. For the right hand operation, the joystick 10 performs the supplemental function (for entering key-functions, e.g. 'Shift', etc.), and is controlled by the point finger of right hand. For the left hand operation, the joystick 10 performs the main function (for entering symbols, i.e. letters, numbers, and other characters), and is controlled by the thumb of left hand.

The keys 11, 12, and 13, with fixed positions of the middle finger, ring finger, and pinky finger of the left hand respectively, are mounted on the right side 5. When the switch 6 is set into the 'left hand' position, corresponding to the left hand operation, the keys 11, 12, and 13 are activated. When the switch 6 is set into the 'right hand' position, corresponding to the right hand operation, the keys 11, 12, and 13 are deactivated.

The joystick 14 is disposed above the key 11. For the left hand operation, the joystick 14 performs the supplemental function (for entering key-functions), and is controlled by the point finger of left hand. For the right hand operation, the joystick 14 performs the main function (for entering symbols), and is controlled by the thumb of right hand.

Preferred Embodiment of Inventive Method

The inventive method for hand input of digital information for a plurality of symbols and a plurality of key-functions into a digital data processor, wherein the method comprises the following steps:
a) providing the above-described inventive device including:
three predetermined keys (11, 12, and 13) for pressing by the middle finger, the ring finger, and the pinky finger of the left hand;
three predetermined keys (7, 8, and 9) for pressing by the middle finger, the ring finger, and the pinky finger of the right hand;
a first five-position joystick (10), wherein the five position are appointed to 'enter', 'left', 'right', 'up', and 'down', operating in a main mode for pressing by the thumb of the left hand for 'enter', and operating in a supplemental mode for switching by the point finger of the right hand into the 'left', 'right', 'up', 'down' and 'enter' (pressing) positions; and
a second five-position joystick (14), wherein the five position are appointed to 'enter', 'left', 'right', 'up', and 'down', operating in a main mode for pressing by the thumb of the right hand for 'enter', and operating in a supplemental mode for switching by the point finger of the left hand into the 'left', 'right', 'up', 'down' and 'enter' (pressing) positions;
b) assigning a plurality of predetermined unique combinations for pressing by at least one finger of the left hand for each symbol of a plurality of symbols and a first portion of key-functions (e.g. 'Delete', 'Tab', and 'Caps Lock') of a plurality of key-functions for input substantially into the digital processor, wherein the first joystick (10) operates in the main mode, thereby producing a first left-hand table for entering all symbols and the first portion key-functions;
c) assigning a plurality of predetermined unique combinations for switching by the point finger of the left hand for a second portion (remaining) of key-functions (e.g. 'Backspace', 'Blank', 'Shift', 'Esc', 'Change of Language of Entry', 'Keypad Combination: Shift+Next Entered Symbol', 'Keypad Combination: Alt+Next Entered Symbol', and 'Keypad Combination: Ctrl+Next Entered Symbol') of the plurality of key-functions for input substantially into the digital processor, wherein the second joystick (14) operates in the supplemental mode, thereby producing a second left-hand table for entering the second portion key-functions;
d) assigning a plurality of predetermined unique combinations for pressing by at least one finger of the right hand for each symbol of a plurality of symbols and the first portion of key-functions (e.g. 'Delete', 'Tab', and 'Caps Lock') of the plurality of key-functions for input substantially into the digital processor, wherein the second joystick (14) operates in the main mode, thereby producing a first right-hand table for entering all symbols and the first portion key-functions;
e) assigning a plurality of predetermined unique combinations for switching by the point finger of the right hand for the second portion (remaining) key-functions (e.g. 'Backspace', 'Blank', 'Shift', 'Esc', 'Change of Language of Entry', 'Keypad Combination: Shift+Next Entered Symbol', 'Keypad Combination: Alt+Next Entered Symbol', and 'Keypad Combination: Ctrl+Next Entered Symbol') of the plurality of key-functions for input substantially into the digital processor, wherein the first joystick (10) operates in the supplemental mode, thereby producing a second right-hand table for entering the second portion key-functions;
f) converting any symbol or key-function entered by a combination of fingers, corresponding to one of the aforesaid predetermined unique combinations for symbols or key-functions of the aforesaid tables, into a predetermined electrical signal, and inputting the signal into the data processor with, for example, possible viewing on the display (2).

In a preferred embodiment, the first and second right-hand tables are identical to the first and second left-hand tables respectively. The sample first (Table 1) and second (Table 2) tables are illustrated on FIGS. 3 and 4. In optional embodiments, the aforesaid unique combinations for symbols or key-functions can be preset by the user, and/or preset by the manufacturer of the inventive device.

Exemplary Operation of the Inventive Device

An example of operation of the inventive device follows. The symbol 'p' can be entered by the right (left) hand, according to Table 1 and Table 2, the switch 6 is set into the "right hand" position ("left hand"), the joystick 14 (10) is moved by the thumb into the "Up" position, simultaneously the key 7 (13) is pressed by the pinky finger and the key 8 (12) is pressed by the ring finger. The display 2 shows the symbol 'p' that is entered as an electric signal into the data processing apparatus.

Table 2 shows key-function commands executed by the joystick 10 (14) for entry by the right (left) hand. It is experimentally determined, that the preferable time of retaining the joystick 10 (14) in the 'Up', 'Down', 'Left', and 'Right' positions is substantially 0.6 second. For instance, the change of entry language is carried out by moving the joystick 10 (14) in the 'Left' position and retaining it substantially for 0.6 seconds. In optional embodiments, the user can regulate this duration at his/her convenience (a respective control means can be mounted in the device, which is not shown herein). The 'Backspace' command can be performed at a lesser time. The greater time leads to slowing the entry of data. The commands 'Shift', 'Blank', 'Esc', and the keypad combinations 'Shift'+Next Entered Symbol, 'Alt'+Next Entered Symbol, and 'Ctrl'+Next Entered Symbol are performed analogously, by movements of the supplemental joystick 10 (14) with the retaining time mentioned above. After completion of the data entry, the switch 6 is set into the 'blocking' neutral position.

Another example: entering the 'S' letter. The following steps should be performed: (a) the supplemental joystick 10 is set in the 'Down' position by the point finger (e.g. of the right hand); (b) the main joystick is set at the 'Center' position by the thumb of the same hand; (c) the keys 7, 8, and 9 are pressed respectively with the pinky, ring, and middle fingers of the same hand. The display 2 shows the letter 'S', based on the electrical signal generated upon the aforesaid entries. The switch 6 is then set into the 'blocking' position.

POSSIBLE INDUSTRIAL APPLICATIONS OF THE INVENTIVE DEVICE

The inventive method and device allow for:
A) providing a keyboard 4-6 times smaller than the conventional keyboards;
B) entering data by the 'blind' method and with one hand;

C) simplifying the process of learning the 'blind' method, since the fingers don't move above the keys and switches;
D) creating devices deployable where only one hand can be used for data entry (e.g. the second hand is used for control of another device, or where it is absent), and where it is impossible to visually control the fingers entering the data;
E) designing embodiments of the inventive device integrated into various apparatuses, e.g. into a computer mouse;
F) designing new improved control means, for example, performed as handles for controlling machines and mechanisms.

I claim:

1. A method for hand inputting data, represented by a combination selected from a plurality of symbols and a plurality of key-functions, substantially into a digital data processor, said plurality of key-functions consists of a first portion and a second portion of key-functions, said method comprising the steps of:
 a) providing a device for hand input of symbol and key-function information into the digital data processor including the following:
  three keys for pressing by the middle finger, the ring finger, and the pinky finger of the left hand;
  three keys for pressing by the middle finger, the ring finger, and the pinky finger of the right hand;
  a first joystick having at least five positions including 'enter', 'left', 'right', 'up', and 'down'; said first joystick is operable in a main mode for pressing by the thumb of the left hand for 'enter', and operable in a supplemental mode for switching its positions into 'left', 'right', 'up', and 'down' by the point finger of the right hand; and
  a second joystick having at least five positions including 'enter', 'left', 'right', 'up', and 'down'; said second joystick is operable in a main mode for pressing by the thumb of the right hand for 'enter', and operable in a supplemental mode for switching its positions into 'left', 'right', 'up', and 'down' by the point finger of the left hand;
 b) assigning a plurality of predetermined unique combinations for entering by at least one finger of the left hand to each symbol of said plurality of symbols and to each key-function of said first portion, wherein the first joystick operates in the main mode, thereby producing a first left-hand table for entering all symbols of said plurality of symbols and the key-functions of said first portion;
 c) assigning a plurality of predetermined unique combinations for entering by the point finger of the left hand to each key-function of said second portion, wherein the second joystick operates in the supplemental mode, thereby producing a second left-hand table for entering the key-functions of said second portion;
 d) assigning a plurality of predetermined unique combinations for entering by at least one finger of the right hand to each symbol of said plurality of symbols and to each key-function of said first portion, wherein the second joystick operates in the main mode, thereby producing a first right-hand table for entering all symbols of said plurality of symbols and the key-functions of said first portion;
 e) assigning a plurality of predetermined unique combinations for entering by the point finger of the right hand to each key-function of said second portion, wherein the first joystick operates in the supplemental mode, thereby producing a second right-hand table for entering the key-functions of said second portion; and
 f) converting any symbol or key-function entered by a combination of fingers, corresponding to one of the predetermined unique combinations for symbols or key-functions of the first right-hand and left-hand tables and the second right-hand and left-hand tables, into a predetermined electrical signal, and inputting the signal into the data processor.

2. The method according to claim 1, wherein the first right-hand table is identical to the first left-hand table, and the second right-hand table is identical to the second left-hand table.

3. The method according to claim 1, wherein the predetermined unique combinations for symbols or key-functions of said first right-hand and left-hand tables and said second right-hand and left-hand tables are preset by the user and/or by the manufacturer of said device.

4. The method according to claim 1, wherein a time for retaining said first and second joysticks for the key-functions of said second portion in the supplemental mode is provided for 0.6 second.

* * * * *